US010460761B2

(12) United States Patent
Kashiwagi

(10) Patent No.: US 10,460,761 B2
(45) Date of Patent: Oct. 29, 2019

(54) DEFECT REGISTRATION METHOD

(71) Applicants: Kabushiki Kaisha Toshiba, Minato-ku, Tokyo (JP); Toshiba Electronic Devices & Storage Corporation, Minato-ku, Tokyo (JP)

(72) Inventor: Kazuto Kashiwagi, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/116,237

(22) Filed: Aug. 29, 2018

(65) Prior Publication Data

US 2019/0251997 A1    Aug. 15, 2019

(30) Foreign Application Priority Data

Feb. 15, 2018  (JP) ................. 2018-024634

(51) Int. Cl.
  *G11B 20/18*    (2006.01)
  *G01R 33/12*    (2006.01)

(52) U.S. Cl.
  CPC ...... *G11B 20/1889* (2013.01); *G01R 33/1207* (2013.01); *G11B 20/1816* (2013.01); *G11B 2020/1826* (2013.01); *G11B 2020/1896* (2013.01); *G11B 2220/2516* (2013.01)

(58) Field of Classification Search
  CPC ......... G11B 27/36; G11B 20/12; G11B 20/18; G11B 20/1816; G11B 19/041; G11B 33/10; G11B 20/1889
  USPC ....... 360/31, 48, 53; 369/53.1, 53.12, 53.15, 369/53.17
  See application file for complete search history.

(56) References Cited

U.S. PATENT DOCUMENTS

| 6,633,442 | B2 | 10/2003 | Quak et al. |
| 6,757,119 | B2 | 6/2004 | Leow et al. |
| 2010/0149681 | A1 | 6/2010 | Masuyama |

FOREIGN PATENT DOCUMENTS

JP    2007-257746    * 10/2007    ............... G11B 5/00

* cited by examiner

*Primary Examiner* — Nabil Z Hindi
(74) *Attorney, Agent, or Firm* — White & Case LLP

(57) ABSTRACT

According to one embodiment, a defect registration method includes measuring, performing first extracting, and registering. The measuring is measuring, on a unit-area basis, performance of a storage area of a magnetic disk including a plurality of unit areas. The storage area includes a redundant area of a set capacity. The first extracting includes second extracting one or more unit areas in order of increasing the performance. The registering is registering the extracted unit areas of the set capacity as defect locations.

11 Claims, 7 Drawing Sheets

DEFECT REGISTRATION METHOD

CROSS-REFERENCE TO RELATED APPLICATIONS

This application is based upon and claims the benefit of priority from Japanese Patent Application No. 2018-024634, filed on Feb. 15, 2018; the entire contents of which are incorporated herein by reference.

FIELD

Embodiments described herein relate generally to a defect registration method.

BACKGROUND

Magnetic disks include inherent defects. In order to prevent defect locations from being assigned to a user area, conventionally, defect locations are identified prior to shipment of hard disk devices. The defects identified before shipment can be referred to as primary defects.

The primary-defect locations are set as non-usable and not assigned to the user area. As an example, the assignment of logical addresses to primary-defect locations is inhibited. A reduced capacity of a magnetic disk due to the non-use of primary-defect locations can be compensated for by a redundant area prepared in the magnetic disk.

DETAILED DESCRIPTION

In general, according to one embodiment, a defect registration method includes measuring, performing first extracting, and registering. The measuring is measuring, on a unit-area basis, performance of a storage area of a magnetic disk including a plurality of unit areas. The storage area includes a redundant area of a set capacity. The first extracting includes second extracting one or more unit areas in order of increasing the performance. The registering is registering the extracted unit areas of the set capacity as defect locations.

Exemplary embodiments of the defect registration method will be explained below in detail with reference to the accompanying drawings. The following embodiments are merely exemplary and not intended to limit the scope of the present invention.

First Embodiment

Figure 1:
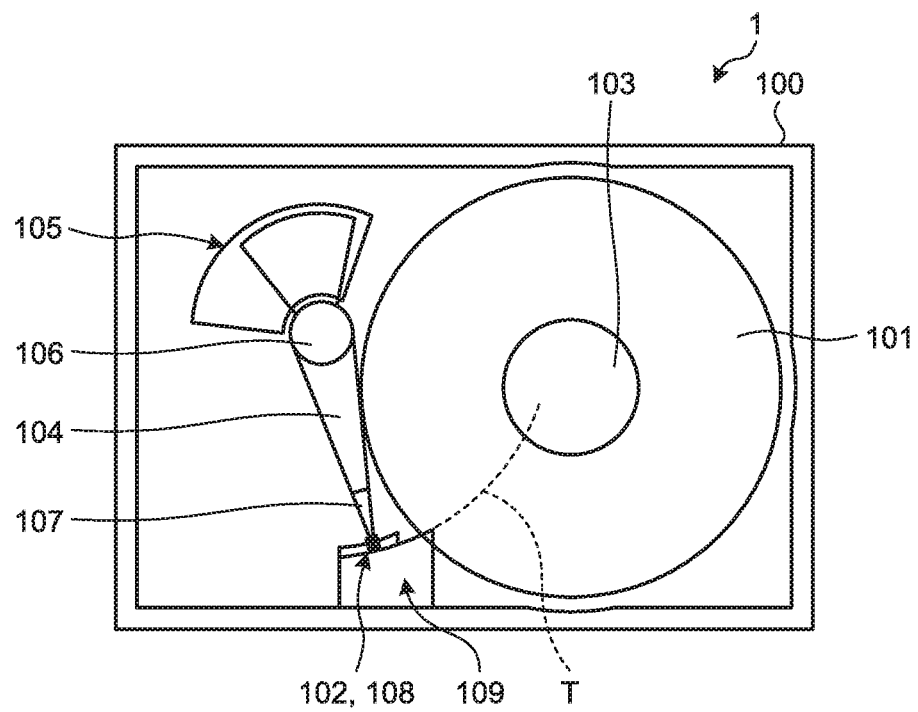
FIG. 1 is a diagram illustrating an example of the hardware configuration of a hard disk device according to a first embodiment.

FIG. 1 is a diagram illustrating an example of the hardware configuration of a hard disk device according to a first embodiment. FIG. 1 illustrates the internal structure of a hard disk device 1 inside a housing 100 with a top cover removed. As illustrated in FIG. 1, the hard disk device 1 includes a magnetic disk 101, and a magnetic head 102 that reads and writes data.

Figure 2:
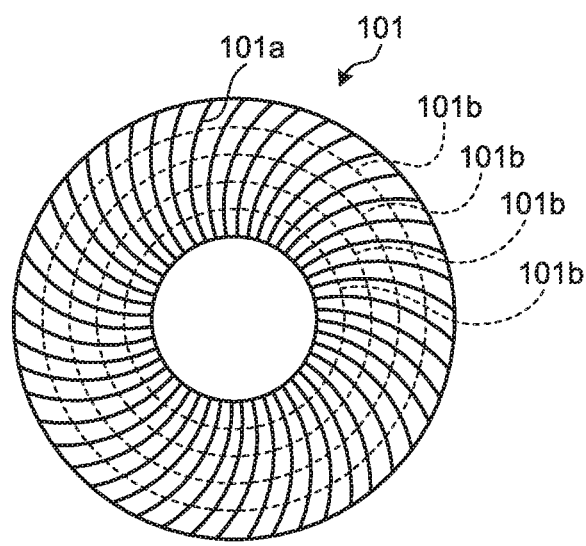
FIG. 2 is a diagram illustrating an example of the configuration of a magnetic disk according to the first embodiment.

The hard disk device 1 includes two magnetic disks, and the magnetic disk 101 in FIG. 2 is one (a first magnetic disk 101) of them. The other magnetic disk (a second magnetic disk 101 (refer to FIG. 3)) is placed on the back side of the first magnetic disk 101 (the rear side in FIG. 1). The first embodiment describes two magnetic disks. However, the number of magnetic disks may be only one, or three or more.

The first magnetic disk 101 and the second magnetic disk 101 are attached to a rotary shaft 103 of a spindle motor with a predetermined pitch along the axis of the rotary shaft 103, to integrally rotate at same rotational speed along with the rotation of the rotary shaft 103.

The magnetic head 102 is attached to a distal end of an arm 104. The arm 104 is driven by a voice coil motor (VCM) 105, and rotates about a shaft 106 within a determined range in positive and negative directions. This operation moves the magnetic head 102 along a broken line T, and positions the magnetic head 102 on any of tracks in the radial direction of the magnetic disk 101. The magnetic head 102 and the arm 104 form a head unit, and the magnetic disks 101 include a total of four head units on the front sides and the back sides, respectively. The head units can be individually identified with head numbers.

Specifically, the magnetic head 102 is mounted on a head slider 108 at the distal end of a suspension 107 provided to the distal end of the arm 104. The magnetic head 102 includes a read element and a write element. The read element reads data from a scan surface of the magnetic disk 101, and the write element writes data to the scan surface of the magnetic disk 101. In other words, the magnetic head 102 accesses the recording surface (a storage area 110) of the magnetic disk 101. In the example illustrated in FIG. 1, the magnetic head 102 reads and writes data from and to the front side of the first magnetic disk 101.

In addition, the hard disk device 1 includes a ramp loading mechanism 109 that withdraws the magnetic head 102 from over the magnetic disk 101 for parking.

The hard disk device 1 includes, at the bottom (the rear side in FIG. 1) a control circuit 20 (refer to FIG. 3) that controls each component of the hard disk device 1. The control circuit 20 communicates with a host (not illustrated) via an interface such as a connecting pin provided to the housing 100 of the hard disk device 1 for external connections, and controls each component of the hard disk device 1 in response to, for example, a command from the host.

FIG. 2 is a diagram illustrating an example of the configuration of the magnetic disk 101 according to the first embodiment. The magnetic disk 101 includes a magnetic substance on both sides of a platter, and contains servo information that is written thereonto prior to shipment by, for example, a servo writer. The servo information refers to, for example, a burst pattern. FIG. 2 illustrates radial arrangement of servo zones 101a to which the servo information has been written, as an example of the arrangement of servo zones. The magnetic disk 101 includes a plurality of concentric tracks 101b with a predetermined radial pitch. A large number of sectors are continuously formed on the circle of each track 101b. Each sector includes a magnetic region to which data is rewritable.

Figure 3:
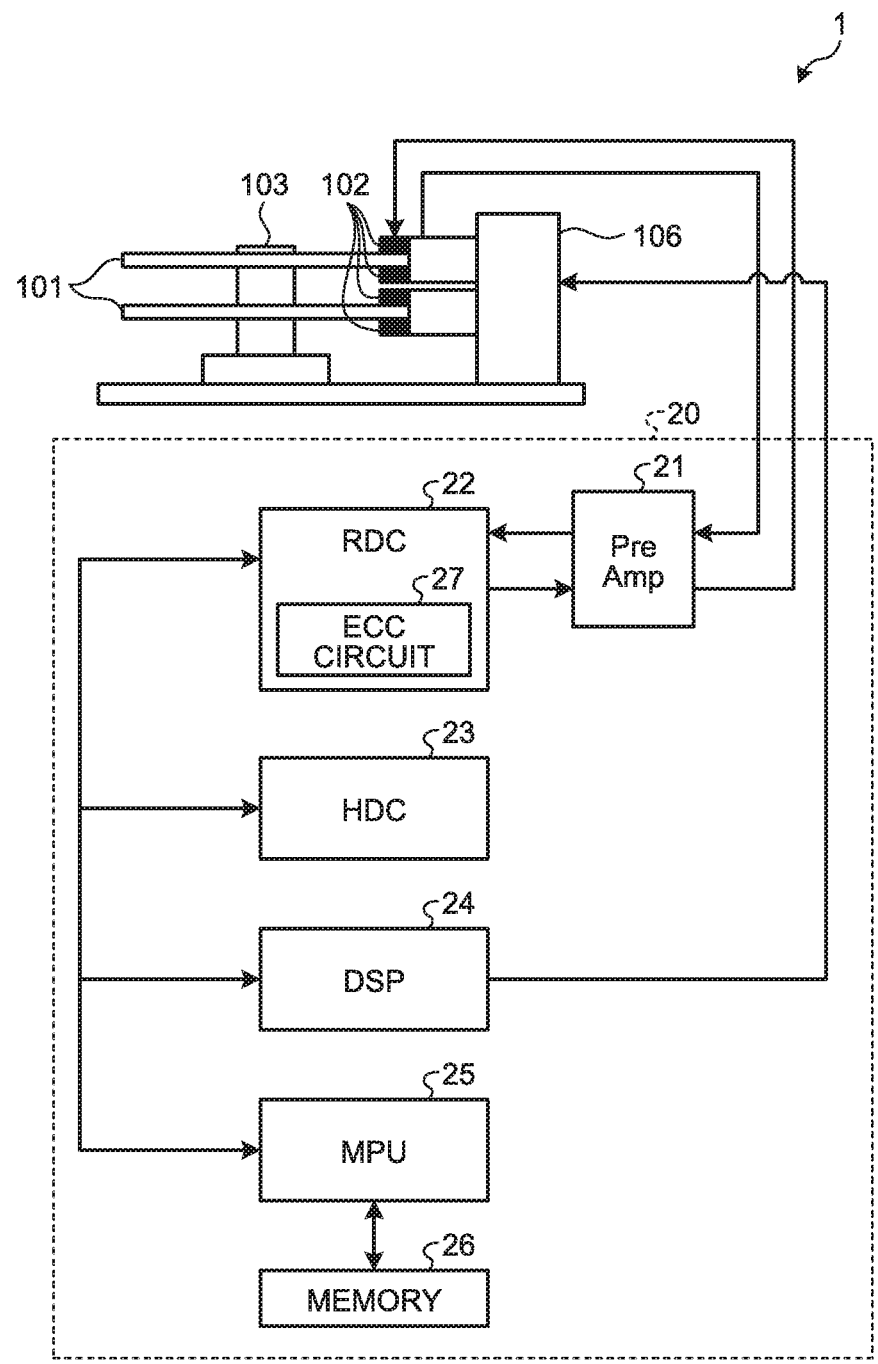
FIG. 3 is a diagram illustrating an example of the configuration of a control circuit of the hard disk device according to the first embodiment.

FIG. 3 is a diagram illustrating an example of the configuration of the control circuit 20 of the hard disk device 1 according to the first embodiment. In FIG. 3, the same controlled elements are denoted by the same reference numerals as those illustrated in FIG. 1. As illustrated in FIG. 3, the control circuit 20 includes a preamplifier (PreAmp) 21, a read channel circuit (RDC) 22, a hard disk controller (HDC) 23, a digital signal processor (DSP) 24, a micro processing unit (MPU) 25, and a memory 26.

The preamplifier 21 amplifies and outputs a signal read by the magnetic head 102 (the read element) from the magnetic disk 101, and supplies the signal to the RDC 22. Moreover, the preamplifier 21 amplifies a signal supplied from the RDC 22, and supplies the signal to the magnetic head 102 (the write element).

The RDC 22 includes an ECC (error correction code) circuit 27 that executes data encoding and decoding for error correction. The RDC 22 controls the ECC circuit 27 to encode data to be written to the magnetic disk 101, and supplies the encoded data to the preamplifier 21 as a signal. The RDC 22 controls the ECC circuit 27 to decode a signal read from the magnetic disk 101 and supplied from the preamplifier 21, to thereby detect and correct error in the signal. The RDC 22 then outputs the error-corrected signal to the HDC 23 as digital data.

An encoding and decoding method for error correction used by the ECC circuit 27 is not limited to a specific method. As an example, a low density parity check (LDPC) can be adopted.

The DSP 24 controls the spindle motor and the VCM 105 to perform positioning control such as seek and following. Specifically, for the positioning control, the DSP 24 obtains servo information from a signal from the RDC 22, demodulates the servo information, and computes a VCM drive command value in accordance with an error between a location demodulated from the servo information and a target location.

The HDC 23 is connected to the host via a predetermined interface, and communicates with the host. A standard that the interface conforms to is not limited to a specific standard. The HDC 23 receives data from the RDC 22, and transfers the data to the host. The HDC 23 receives data from the host and outputs the data to the RDC 22.

The MPU 25 analyzes a command of the host received by the HDC 23, and monitors the state of the hard disk device 1, to control each element of the hard disk device 1, for example.

The memory 26 is a data rewritable storage device. The memory 26 functions as an area that stores programs for various operations to be executed by the MPU 25 and various management information, a buffer area, and a cash area, for example. The memory 26 includes a volatile memory, a nonvolatile memory, or a combination thereof. The volatile memory may be, for example, an SRAM (Static Random Access Memory) or a DRAM (Dynamic Random Access Memory). The nonvolatile memory may be a flash memory.

Figure 4:
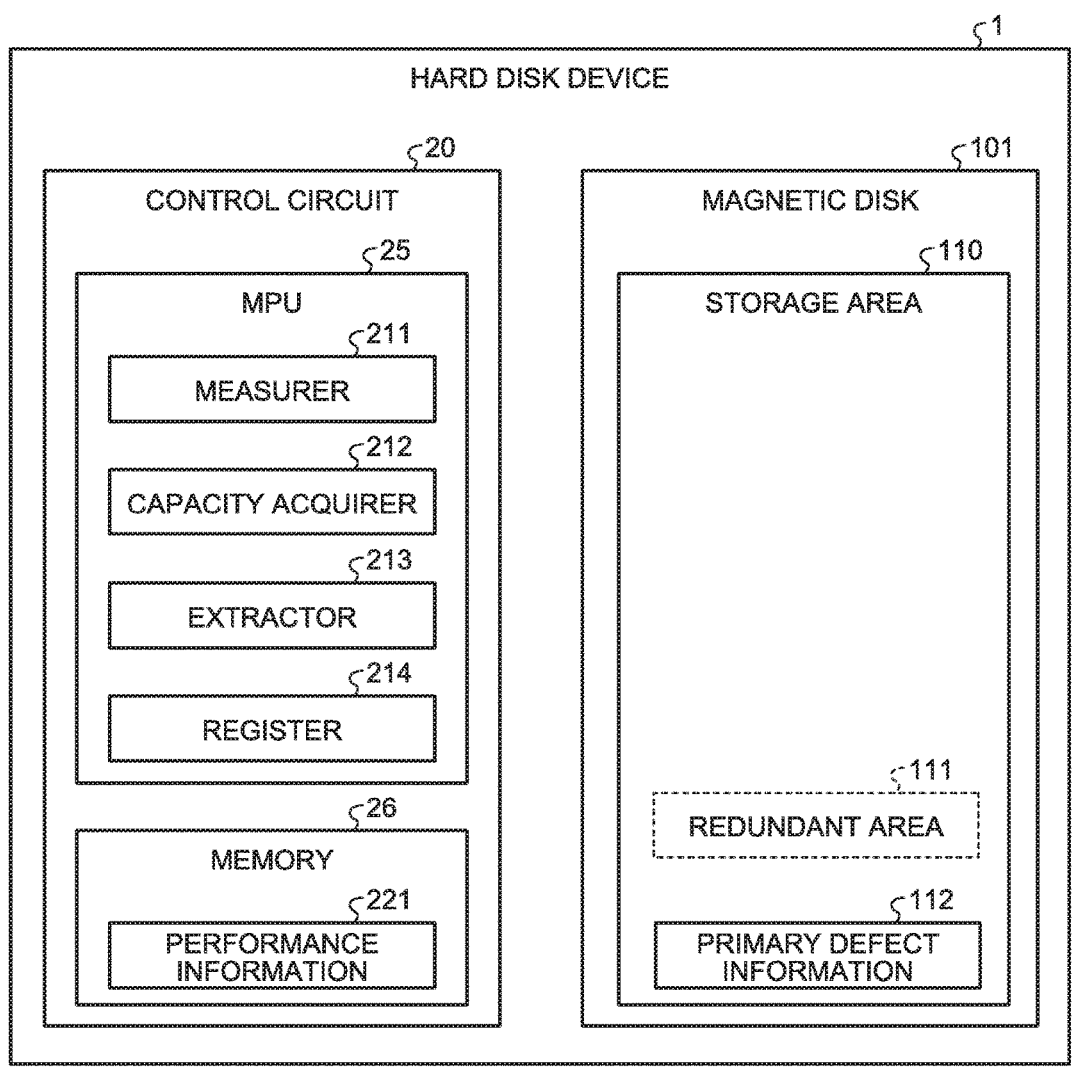
FIG. 4 is a diagram illustrating an example of the functional configuration of the hard disk device according to the first embodiment.

FIG. 4 is a diagram illustrating an example of the functional configuration of the hard disk device 1 according to the first embodiment. The magnetic disk 101 includes the storage area 110 including a large number of sectors.

Prior to shipment, the control circuit 20 detects a fault location (a fault sector or track) from the storage area 110, and registers the detected fault location in primary-defect information 112. The primary-defect information 112 is a type of system information. The fault location registered in the primary-defect information 112 is set as non-usable. The location registered in the primary-defect information 112 may be referred to below as a primary-defect location.

The storage area 110 includes a redundant area 111. The redundant area 111 is an area used to substitute for a primary-defect location. In other words, the capacity of the storage area 110 is greater than the declared capacity of the hard disk device 1 by at least the capacity of the redundant area 111. The redundant area 111 has a preset capacity. The redundant area 111 may or may not be a specified area at a predetermined location.

In recent years, along with increases in recording density of a magnetic disk or the number of magnetic disks mounted in a hard disk device, the number of tracks per hard disk device has reached several millions, and the number of sectors per hard disk device several billions to several ten billions. The recording density (such as TPI and BPI) is adjusted in such a manner that the tracks have as uniform quality as possible. However, it is difficult to completely eliminate variations in read and write characteristics caused by, for example, microscopic variations in magnetic characteristics of individual tracks and sectors. In view of improvement in the quality of a hard disk device, it is thus effective to register, as primary-defect locations, not only obvious defect locations such as scratches and a servo failure (hereinafter referred to as classical defects) but also locations exhibiting low read and write characteristics.

For comparison with the present invention (a comparative example), there is a method for identifying a primary-defect location through a comparison with reference to a fixed quality criterion. However, unlike classical defects, it is difficult to predict read and write characteristics. Hence, for adopting the comparative example, it is difficult to determine a quality criterion for the comparison in advance. For example, with a higher quality criterion set, the total capacity of primary-defect locations may exceed the capacity of the redundant area 111, resulting in inability to provide users with the storage area of the declared capacity. With a lower quality criterion set, locations exhibiting relatively low read and write characteristics are provided to users, resulting in degradation in the quality of a hard disk device.

According to the first embodiment, the performance of each location in the storage area 110 is measured. Numerical values indicating inferior performance are measured from locations having classical defects and locations having inferior read and write characteristics. Numerical values indicating good performance are measured from locations having good read and write characteristics with no classical defect. Locations corresponding to the capacity of the redundant area 111 are extracted on the basis of the measured performance, to register each of the extracted locations in the primary-defect information 112 as the primary-defect location. In other words, the registered primary-defect locations account for the entire redundant area 111. In the extraction process, locations are extracted in order of increasing performance. This makes it possible to register locations having inferior read and write performance as many as possible as the primary-defect locations, leading to quality improvement.

As an example, the control circuit 20 performs identification and registration of a primary-defect location. The control circuit 20 starts identification and registration process to a primary-defect location, when receiving a dedicated command from the host. The control circuit 20 includes the following elements to execute the identification and registration process to a primary-defect location.

The MPU 25 functions as a measurer 211, a capacity acquirer 212, an extractor 213, and a register 214 by a predetermined program stored in the memory 26 or the like.

The measurer 211 measures the performance of each location in the storage area 110. The location herein refers to an area to be a unit of various processes, that is, a unit area. The unit area can be freely set. The unit area is, for example, a sector or a track.

An evaluation index for performance to be measured is not limited to a specific evaluation index. For example, the measurer 211 can test data read and write to and from sectors to find error indicators and adopt them as evaluation indexes.

The error indicators may be, for example, a sector error rate. To acquire an accurate sector error rate, however, approximate 100 to 100000 reads and writes to and from all the sectors are required. In terms of manufacturing process time, performing such a large number of data reads and writes over several billion to several ten billion sectors in the hard disk device 1 is not realistic.

Hence, in order to reduce the measurement time, the measurer 211 may acquire, for example, the number of bit errors, detected and corrected by the ECC circuit 27 in the RDC 22, in read data from a single sector as performance of the sector. Alternatively, the measurer 211 may acquire Viterbi metric margin (VMM) upon Viterbi decoding as performance, for example.

The measurer 211 records measurement results, that is, measured values of performance, in performance information 221, and stores the performance information 221 in the memory 26. The hard disk device 1 includes a great number of sectors so that recording the measured values of all the sectors by the measurer 211 increases the necessary size of the performance information 221 for recording. In view of this, the measurer 211 may change the granularity of recording of measured values from sectors to tracks. Specifically, for example, the measurer 211 computes the performance of one track on the basis of multiple measured values of multiple sectors of the track.

A method for computing the performance of tracks is not limited to a specific method. For example, the measurer 211 computes the average of measured values of all the sectors of one track, and records the average in the performance information 221 as a value indicating the performance of the track (a first acquisition method).

In the following, values indicating measured or computed performance will be referred to as performance evaluation values, or simply evaluation values.

An evaluation value of a track found by the first acquisition method depends largely on variations in evaluation values of sectors in the track concerned. Depending on variations in the evaluation values of the sectors in the track, the track containing a sector having a particularly low evaluation value may not be evaluated as low enough to be extracted as a primary-defect location. That is, a track that needs to be extracted may not be extracted as a primary-defect location. In order to prevent this, for example, the measurer 211 may record, as the evaluation value of a track, the lowest value of the evaluation values of all the sectors in the track in the performance information 221 (a second acquisition method).

Herein, a low evaluation value refers to inferior performance. For example, in the case of employing the number of bit errors as an evaluation index for the performance, the higher the evaluation value is, the more inferior the performance indicated by the evaluation value is. A relationship between the magnitude of an evaluation value and the level of performance may change depending on the evaluation index for the performance.

Moreover, the reproducibility of measurement of an evaluation value of a sector may be low in some cases. In such cases, in the second acquisition method, noise may occur and affect the measurement of an evaluation value of a certain sector and lowers the value than it should be for representing the actual performance. This value may be recorded as an evaluation value of a track. In other words, an operable track may be extracted as a primary-defect location due to the influence of noise.

Hence, the measurer 211 may compute an evaluation value of one track from any of the second and subsequent lowest values among the evaluation values of all the sectors of the track in question (a third acquisition method), for example. As an example, when one track contains 500 sectors, the measurer 211 sets the fifth lowest value among the evaluation values of the 500 sectors as the evaluation value of the track. Alternatively, the measurer 211 sets evaluation values from a certain ordinal (for example, first) lowest value to a certain ordinal (for example, fifth) lowest value among the evaluation values of all the sectors in the track in question, as the performance evaluation values of the track. Thus, by considering the second and subsequent lowest values among the evaluation values of all the sectors of one track, it is made possible to acquire the evaluation value of the track with the influence of both the variations and noise reduced.

The measurer 211 records a performance evaluation value of a track and a physical address of the track in pair in the performance information 221.

The measurer 211 changes the granularity of recording of a measurement result from a sector to a track by way of example. However, the measurer 211 may not necessarily change the granularity of recording of a measurement result. That is, the measurer 211 may record an evaluation value of each sector in the performance information 221. In this case, the measurer 211 needs to record an evaluation value of each sector and a physical address of the sector in pair in the performance information 221.

The capacity acquirer 212 acquires the capacity of an available area as a substitute for a primary-defect location, that is, the capacity of the redundant area 111. The capacity of the redundant area 111 may be provided as a parameter during manufacturing. In this case, the capacity acquirer 212 reads the parameter. The capacity acquirer 212 may assign, for example, logical addresses corresponding to the declared capacity to physical addresses of the storage area 110, and find the capacity of the redundant area 111 by calculating the amount of physical addresses, of the storage area 110, to which no logical addresses are assigned.

The extractor 213 extracts tracks corresponding to the capacity of the redundant area 111 from all the tracks in order of the evaluation values recorded in the performance information 221, starting from the lowest evaluation value.

For example, the extractor 213 sorts the physical addresses of all the tracks in order of the evaluation values recorded in the performance information 221. The extractor 213 then selects the physical addresses of the tracks corresponding to the capacity of the redundant area 111, starting from the one with most inferior performance, on the basis of a column of the physical addresses obtained by the sorting. The extraction method is not limited to this example.

The register 214 records all the tracks extracted by the extractor 213 in the primary-defect information 112. The register 214 records the registered primary-defect information 112 as system information in the storage area 110.

Figure 5:
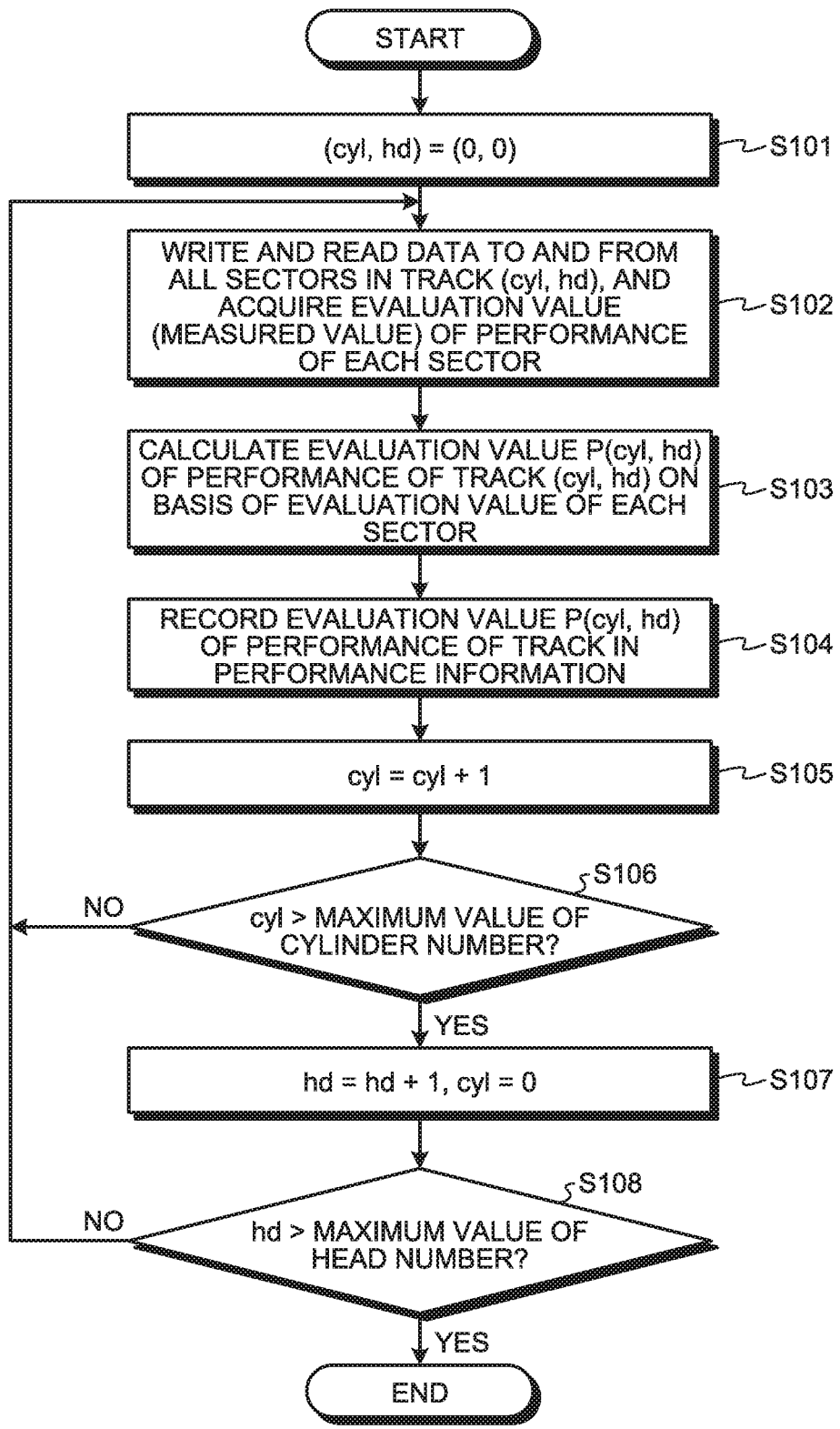
FIG. 5 is a flowchart illustrating an example of the operation of a measurer according to the first embodiment.

Next, a method for registering a defect of a magnetic disk in the first embodiment is described. FIG. 5 is a flowchart illustrating an example of the operation of the measurer 211 according to the first embodiment.

Firstly, the measurer 211 initializes a pair of parameters (cyl, hd) indicating a track to measure to (0, 0) (S101). The parameter cyl indicates a cylinder number, and the parameter hd indicates a head number. In the example of FIG. 5, a physical address indicating the location of each track is expressed in a pair of cylinder number and head number. In the following, a track at a location specified by the parameter pair (cyl, hd) will be referred to as a track (cyl, hd).

The measurer 211 writes and reads data to and from all the sectors of the track (cyl, hd), and acquires an evaluation value of each sector (S102). As an example, the measurer 211 acquires, from the ECC circuit 27, the number of bit errors in data read from a sector as an evaluation value of the sector.

The measurer 211 then calculates a performance evaluation value of the track (cyl, hd) on the basis of the acquired evaluation value of each sector (S103). For example, the measurer 211 acquires the performance evaluation value of the track (cyl, hd) by an arbitrary method including the above-mentioned first to third acquisition methods. The performance evaluation value of the track (cyl, hd) is denoted by P(cyl, hd).

The measurer 211 then records the acquired performance evaluation value P(cyl, hd) of the track in the performance information 221 (S104). For example, the measurer 211 records the evaluation value P(cyl, hd) in additional format in association with the physical address (cyl, hd) of the track (cyl, hd).

Next, the measurer 211 increments the value of the parameter cyl by one (S105), and determines whether or not the value of the parameter cyl exceeds the maximum value of the cylinder number (S106). If the value of the parameter cyl does not exceed the maximum value of the cylinder number (No in S106), the measurer 211 re-executes the operation of S102.

If the value of the parameter cyl exceeds the maximum value of the cylinder number (Yes in S106), the measurer 211 increments the value of the parameter hd by one, and resets the value of the parameter cyl to zero (S107). The measurer 211 then determines whether or not the value of the parameter hd exceeds the maximum value of the head number (S108). If the value of the parameter hd does not exceed the maximum value of the head number (No in S108), the measurer 211 re-executes the operation of S102.

If the value of the parameter hd exceeds the maximum value of the head number (Yes in S108), the operation of the measurer 211 ends.

Figure 6:
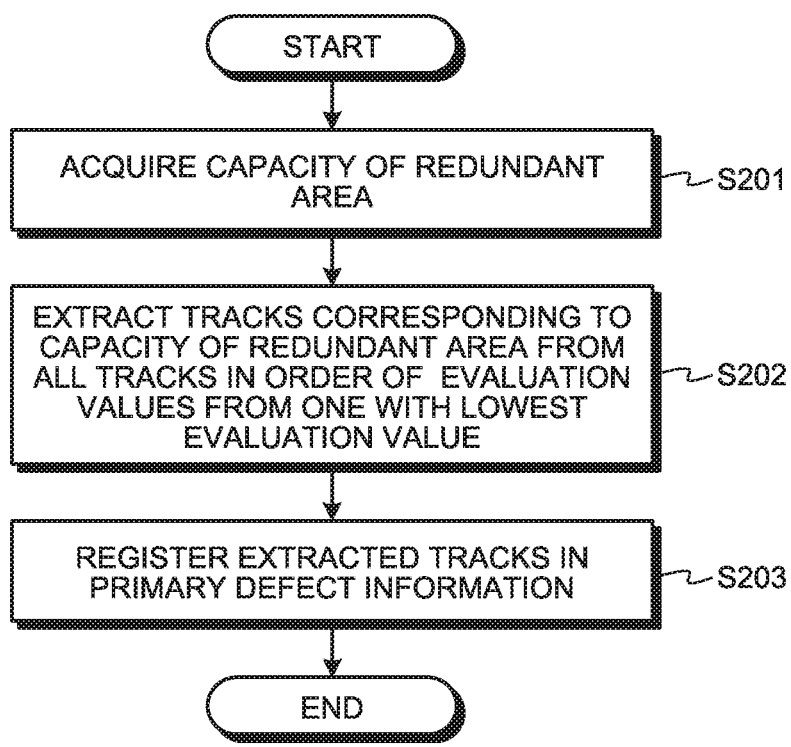
FIG. 6 is a flowchart illustrating an example of the operation of a capacity acquirer, an extractor, and a register according to the first embodiment.

FIG. 6 is a flowchart illustrating an example of the operation of the capacity acquirer 212, the extractor 213, and the register 214 according to the first embodiment. A series of operations illustrated in FIG. 6 is executed after the operation of the measurer 211 illustrated in FIG. 5.

Firstly, the capacity acquirer 212 acquires the capacity of the redundant area 111 (S201).

Next, the extractor 213 extracts tracks corresponding to the capacity of the redundant area 111 from all the tracks in order of the evaluation values recorded in the performance information 221, starting from the one with the lowest evaluation value (S202).

Next, the register 214 registers all the extracted tracks in the primary-defect information 112 (S203). For example, the register 214 records the physical addresses (cyl, hd) of all the extracted tracks in the primary-defect information 112.

The operation of the capacity acquirer 212, the extractor 213, and the register 214 ends in S203.

The completed primary-defect information 112 is used, for example, in assigning the logical addresses corresponding to the declared capacity to the physical addresses of the storage area 110. No logical addresses are assigned to locations recorded as primary-defect locations in the primary-defect information 112. Consequently, logical addresses are not assigned to the locations of an amount corresponding to the prepared capacity of the redundant area 111, therefore, the locations are made unusable.

After the completion of the primary-defect information 112, the control circuit 20 may assign logical addresses in the above manner. The hard disk device 1 may be shipped after the assignment of the logical addresses.

In the above description, the primary-defect information 112 is stored in the storage area 110 by way of example. The location where the primary-defect information 112 is stored is not limited to this example. When the memory 26 includes a nonvolatile memory, for example, the primary-defect information 112 may be stored in the nonvolatile memory.

In the above description, the redundant area 111 is used as a substitute for a primary-defect location. In addition to the redundant area 111, the storage area 110 may include a second redundant area to prepare for the occurrence of defect locations after shipment.

In the above description, the MPU 25 implements the functions of the measurer 211, the capacity acquirer 212, the extractor 213, and the register 214 by a predetermined program. Alternatively, part or all of the measurer 211, the capacity acquirer 212, the extractor 213, and the register 214 may be implemented by a hardware circuit. In the above description the ECC circuit 27 measures the error indicator. Alternatively, the MPU 25 may measure the error indicator by decoding an error correction code.

As described above, according to the first embodiment, the measurer 211 measures the performance of the storage area 110 on a track basis. The extractor 213 extracts tracks corresponding to the capacity of the redundant area 111 from all the tracks in order of increasing the measured performance. The register 214 registers the extracted tracks as primary-defect locations in the primary-defect information 112. Owing to such configuration, a larger number of locations exhibiting lower read and write characteristics can be set as non-usable than when primary-defect locations are identified and registered on the basis of a fixed quality criterion. This can improve the quality of the hard disk device.

An example, the measurer 211 writes and reads data to and from the storage area 110, and measures the number of bit errors in the read data. By such configuration, the performance evaluation value can be found at higher speed than when the sector error rate is set as the evaluation index for a subject of the measurement.

As described above, the evaluation index for a subject of the measurement is not limited to only the number of bit errors.

In the manufacturing process, for example, a protrusion or protrusions may be unintentionally formed on the surface of the storage area 110, causing deterioration of the performance. Hence, the measurer 211 may measure the number of protrusions on the surface of the storage area 110 as the performance evaluation value. The magnetic head 102 is provided with a contact sensor to detect protrusions, and the measurer 211 counts the number of detected protrusions. The contact sensor is, for example, an acoustic emission (AE) sensor or a frictional heat sensor. The larger the number of detected protrusions is, the more inferior the performance regarded as is.

As another example, the measurer 211 may write and read waveform data to and from the storage area 110, and measure the number of differences between the waveform data before writing and the read waveform data as the performance evaluation value. The measurer 211 counts missing portions of the read waveform data by waveform analysis, using waveform data with a fixed wavelength, for example.

As still another example, the measurer 211 may measure the amount of error in the positioning of the magnetic head 102 as the performance evaluation value. For example, the measurer 211 controls the DSP 24 to control the magnetic head 102 to be positioned in a servo zone near each sector. The measurer 211 then acquires a positioning error amount, that is, an error between a location demodulated from servo information and an intended location, from the DSP 24. The measurer 211 then derives a positioning error amount in each sector from the acquired error. If a sector in question is adjacent to a servo zone, the measurer 211 may set the error acquired from the DSP 24 as the positioning error amount of the sector. If a sector in question and its adjacent servo zone are spaced apart, the measurer 211 may compute a positioning error amount of the sector on the basis of the distance between them.

In the above description, the measurer 211 measures the evaluation value of a single evaluation index, by way of example. Alternatively, the measurer 211 may measure evaluation values for two or more different evaluation indices, to compute one evaluation value by combining the obtained evaluation values. In other words, the measurer 211 may perform measurements of multiple items having different evaluation indices, and compute one performance evaluation value on the basis of the multiple evaluation values obtained by the measurements of the items.

As an example, the measurer 211 measures the number of bit errors, the number of protrusions on the surface of the storage area 110, and the number of missing portions of waveform data, for one unit area. The measurer 211 then computes a performance evaluation value of the unit area on the basis of the measured number of bit errors, the measured number of protrusions on the surface of the storage area 110, and the measured number of missing portions of the waveform data.

A method for computing one evaluation value on the basis of two or more evaluation values obtained by measurements of two or more items is not limited to a specific method. For example, the measurer 211 may multiply each of the evaluation values of different items by a weighting factor, and compute one evaluation value by combining the evaluation values multiplied by the weighting factors. Specifically, the measurer 211 computes the performance evaluation value P(cyl, hd) by the following equation (1):

$$P = \sum_i Ai \cdot Pi. \quad (1)$$

In the equation, Pi(cyl, hd) represents an evaluation value obtained by a measurement of an item I, and Ai represents a weighting factor set for a performance index of the item i.

As described above, the unit area for performance measurement is not limited to a track. The unit area for performance measurement may be a sector. The unit area for performance measurement may be an arbitrary area other than a track and a sector. A plurality of unit areas may contain both a track and a sector.

The measurer 211 measures the performance of each of the sectors in the track, and finds an evaluation value of the track on the basis of the evaluation values obtained by the measurements of the sectors. By such configuration, the size of the performance information 221 stored as temporary data in the memory 26 can be reduced, which can reduce the capacity of the memory 26 accordingly.

Moreover, as an example, the measurer 211 selects the second and subsequent lowest evaluation values sequentially from among the evaluation values obtained by measurements of the sectors of a track. The measurer 211 then finds an evaluation value of the track on the basis of the selected second and subsequent evaluation values. By such configuration, it is made possible to reduce the number of erroneous extractions resulting from the influence of variations in the evaluation values of the sectors and the influence of noise on the evaluation values of sectors in the primary-defect-location extracting process.

Second Embodiment

The first embodiment describes the example of omitting the primary-defect-location identification process with reference to the fixed quality criterion. The defect registration method may include a process with reference to a fixed quality criterion.

Figure 7:
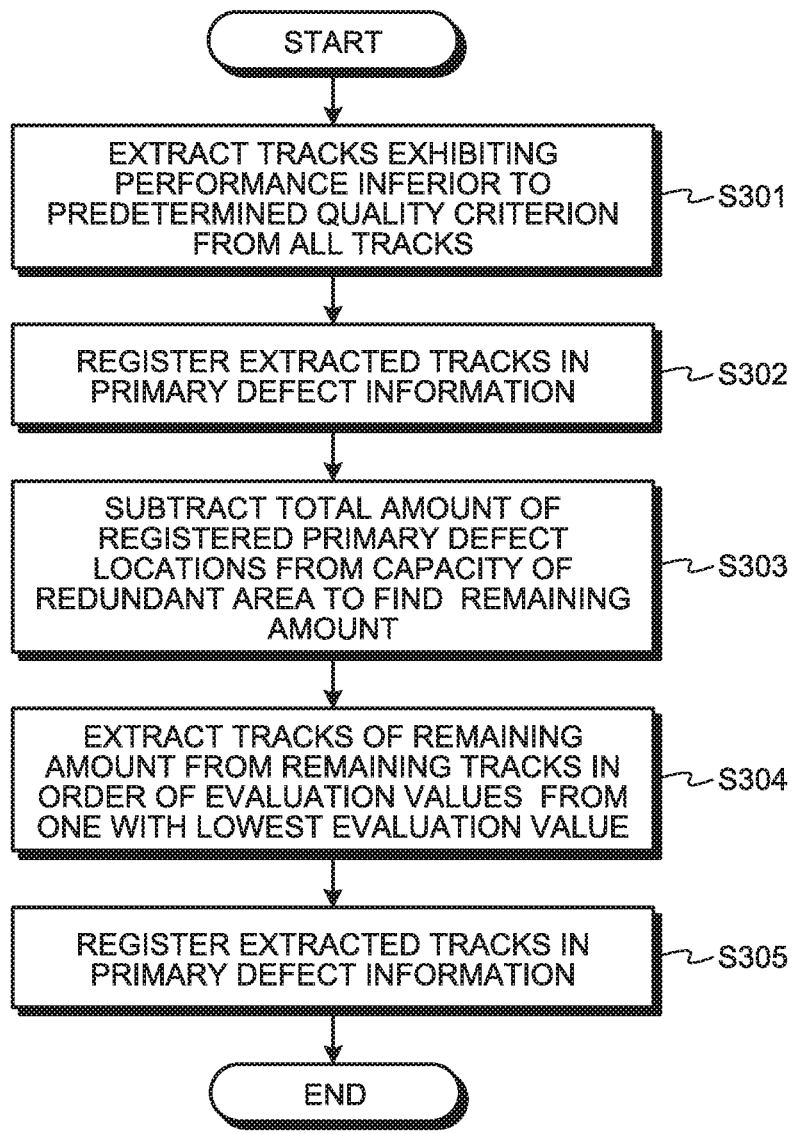
FIG. 7 is a flowchart illustrating an example of the operation of a capacity acquirer, an extractor, and a register according to a second embodiment.

FIG. 7 is a flowchart illustrating an example of the operation of the capacity acquirer 212, the extractor 213, and the register 214 according to a second embodiment. A series of operations illustrated in FIG. 7 is executed after the operation of the measurer 211 illustrated in FIG. 5.

Firstly, the extractor 213 extracts tracks exhibiting performance inferior to a predetermined quality criterion from all the tracks (S301).

In S301, the extractor 213 extracts, for example, tracks having lower evaluation values recorded in the performance information 221 than the predetermined quality criterion.

Alternatively, the measurer 211 may acquire in advance, for each track, an evaluation value for a specific performance index different from a measurement result recorded in the performance information 221, for example. The extractor 213 may extract tracks having lower evaluation values of the specific performance index than the predetermined quality criterion in S301.

After the operation of S301, the register 214 registers all the tracks extracted by the operation of S301 in the primary-defect information 112 (S302).

Next, the capacity acquirer 212 subtracts the total amount of the registered primary-defect locations from the capacity of the redundant area 111 to find a remaining amount (S303). For example, the capacity acquirer 212 may assign logical addresses corresponding to the declared capacity to the storage area 110 excluding the registered primary-defect locations, to compute a remaining amount.

Next, the extractor 213 extracts tracks of the remaining amount in order of the evaluation values recorded in the performance information 221 from all the tracks excluding the tracks registered as the primary-defect locations, starting from the one with the lowest evaluation value (S304).

Next, the register 214 registers all the tracks extracted by the operation of S304 in the primary-defect information 112 (S305).

The operations of the capacity acquirer 212, the extractor 213, and the register 214 end in S305.

Thus, the extractor 213 extracts one or more tracks each exhibiting the performance inferior to a set criterion as primary-defect locations. The capacity acquirer 212 computes a remaining amount excluding the total amount of the extracted one or tracks from the capacity of the redundant area 111. The extractor 213 further extracts tracks of the remaining amount as primary-defect locations in order of increasing the performance. By such configuration, it becomes possible to ensure the identification and registration of locations that do not satisfy the predetermined quality criterion as primary-defect locations.

Third Embodiment

The first and second embodiments describe the example where the hard disk device 1 executes the primary-defect-location identification and registration process. Another device may execute a part or whole of the primary-defect-location identification and registration process in the first and second embodiments.

Figure 8:
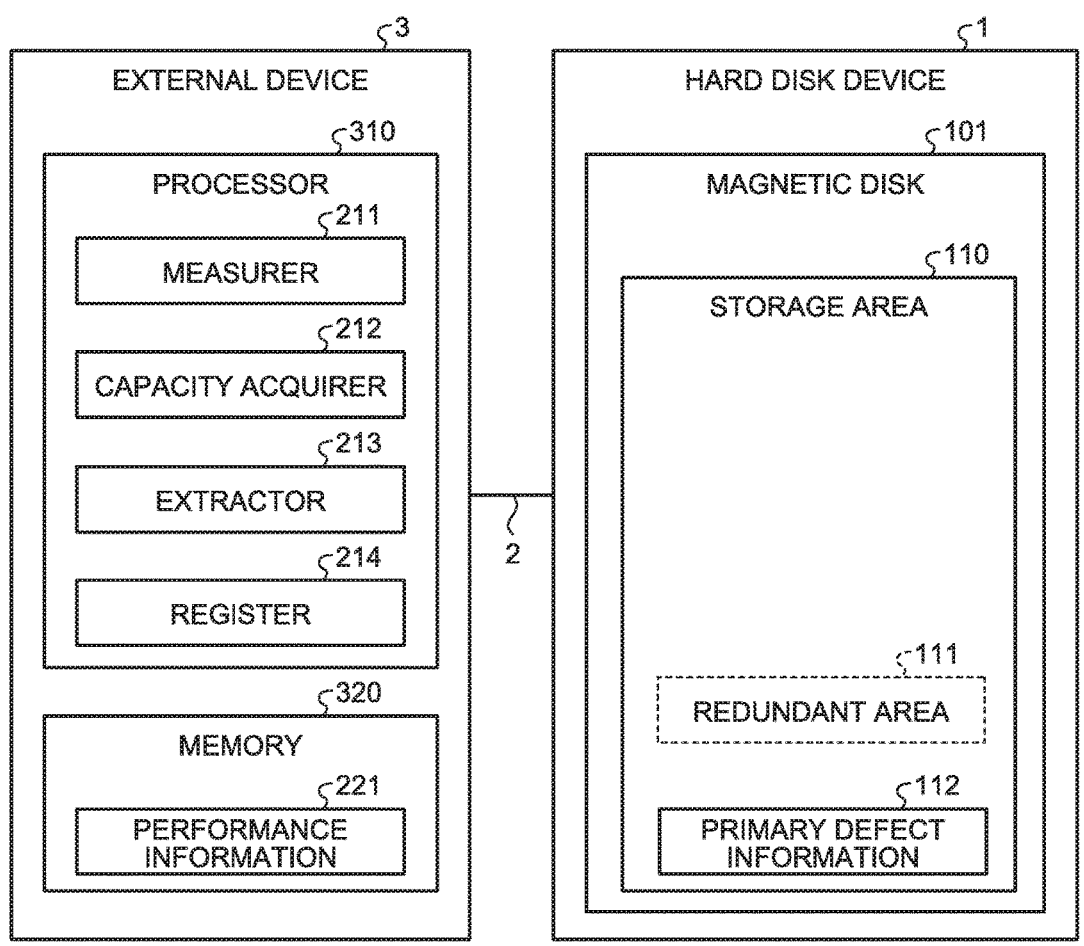
FIG. 8 is a diagram illustrating an example of a configuration for registering primary-defect locations in a hard disk device according to a third embodiment.

For example, as illustrated in FIG. 8, the hard disk device 1 is connected to an external device 3 via a predetermined interface 2 prior to shipment of the hard disk device 1.

One example is that the external device 3 is a computer including a processor 310 and a memory 320. The processor 310 functions as a measurer 211, a capacity acquirer 212, an extractor 213, and a register 214 by a predetermined program. The memory 320 stores performance information 221 in which measurement results by the measurer 211 are recorded.

The measurer 211, the capacity acquirer 212, the extractor 213, and the register 214 function similarly to the elements having the same names described in the first embodiment. The performance information 221 has a configuration similar to that in the first embodiment.

The external device 3 controls the measurer 211, the capacity acquirer 212, the extractor 213, and the register 214 to generate the primary-defect information 112, and stores the generated primary-defect information 112 in the storage area 110. For example, the external device 3 or the control circuit 20 of the hard disk device 1 assigns logical addresses to the storage area 110 except for the primary-defect locations recorded in the primary-defect information 112. After the assignment of the logical addresses, the hard disk device 1 is removed from the external device 3 for shipment.

The external device 3 may be a computer, or a device including a hardware circuit. A part or all of the measurer 211, the capacity acquirer 212, the extractor 213, and the register 214 may be implemented by the hardware circuit.

The third embodiment describes the example in which the external device 3 implements the measurer 211, the capacity acquirer 212, the extractor 213, and the register 214. Alternatively, the hard disk device 1 may implement part of the measurer 211, the capacity acquirer 212, the extractor 213, and the register 214.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A defect registration method comprising:
    measuring, on a unit-area basis, performance of a storage area of a magnetic disk including a plurality of unit areas, the storage area including a redundant area of a set capacity;
    performing first extracting of unit areas up to the set capacity from the plurality of unit areas; and
    registering the extracted unit areas of the set capacity as defect locations, wherein
    the first extracting includes second extracting one or more unit areas in order of increasing the performance.

2. The defect registration method according to claim 1, wherein the measuring includes writing and reading data to and from the storage area, and measuring the number of bit errors in the read data as the performance.

3. The defect registration method according to claim 1, wherein
    at least one of the unit areas is a track including a plurality of sectors, and
    the measuring includes measuring performance of each of the sectors of the track, and acquiring the performance of the track on the basis of a plurality of measured values of the performance of the sectors.

4. The defect registration method according to claim 3, wherein the measuring includes selecting a second or subsequent unit area from a unit area with the least performance.

5. The defect registration method according to claim 1, wherein the first extracting further includes:
    third extracting one or more unit areas each exhibiting the performance inferior to a set criterion; and
    excluding a total amount of the one or more unit areas extracted by the third extracting from the set capacity to find a remaining amount, wherein
    the second extracting is extracting unit areas up to the remaining amount in order of increasing the performance.

6. The defect registration method according to claim 1, wherein the measuring includes measuring Viterbi metric margin upon Viterbi decoding as the performance.

7. The defect registration method according to claim 1, wherein the measuring includes measuring the number of protrusions on a surface of the storage area as the performance.

8. The defect registration method according to claim 1, wherein the measuring includes writing and reading waveform data to and from the storage area, and measuring the number of differences between the waveform data before writing and the waveform data after reading as the performance.

9. The defect registration method according to claim 1, wherein the measuring includes measuring, as the performance, an amount of error in positioning a head that accesses the storage area.

10. The defect registration method according to claim 1, wherein the measuring includes measuring a plurality of items, and computing the performance on the basis of a plurality of measured values of the items.

11. The defect registration method according to claim 10, wherein the measuring includes multiplying each of the measured values by a weighting factor, and combining the measured values multiplied by the weighting factors.

\* \* \* \* \*